United States Patent
Paek et al.

(10) Patent No.: US 8,976,535 B2
(45) Date of Patent: Mar. 10, 2015

(54) CARD KEY FOR VEHICLE AND MAKING METHOD OF THE SAME

(71) Applicant: Hyundai Mobis Co., Ltd., Seoul (KR)

(72) Inventors: Seung Hak Paek, Yongin-si (KR); Ick Tae An, Hwaseong-si (KR)

(73) Assignee: Hyundai Mobis Co., Ltd., Yongin-si (KR)

( * ) Notice: Subject to any disclaimer, the term of this patent is extended or adjusted under 35 U.S.C. 154(b) by 0 days.

(21) Appl. No.: 13/835,558

(22) Filed: Mar. 15, 2013

(65) Prior Publication Data

US 2014/0078689 A1    Mar. 20, 2014

(30) Foreign Application Priority Data

Sep. 14, 2012 (KR) .................. 10-2012-0102334

(51) Int. Cl.
| | |
|---|---|
| H05K 1/00 | (2006.01) |
| H05K 1/18 | (2006.01) |
| H05K 7/00 | (2006.01) |
| H05K 5/00 | (2006.01) |
| H04L 17/02 | (2006.01) |
| H01K 3/22 | (2006.01) |
| H05K 7/02 | (2006.01) |
| G07C 9/00 | (2006.01) |

(52) U.S. Cl.
CPC ... H05K 7/02 (2013.01); G07C 9/00 (2013.01)
USPC ...... 361/748; 361/679.01; 361/757; 341/176; 29/848

(58) Field of Classification Search
CPC .............. E05B 19/046; E05B 19/0082; G07C 9/00944; G07C 2009/00952; H05K 1/141; H05K 3/3447; H05K 3/284; H05K 1/117; H05K 3/3452; H05K 7/1417; H05K 9/0039; H05K 1/0271; H05K 3/0061; F16H 61/0003; H01L 21/56; H06K 19/077; H06K 13/085; H06K 7/0021; B29C 45/14
See application file for complete search history.

(56) References Cited

U.S. PATENT DOCUMENTS

| | | | | |
|---|---|---|---|---|
| 5,088,009 | A * | 2/1992 | Harada et al. | 361/787 |
| 5,666,721 | A * | 9/1997 | Sakemi | 29/843 |
| 7,142,413 | B2 * | 11/2006 | Sugimoto et al. | 361/679.57 |
| 7,370,501 | B2 * | 5/2008 | Miyata et al. | 70/395 |
| 7,577,406 | B2 * | 8/2009 | Nakagawa et al. | 455/90.3 |
| 2006/0245170 | A1 * | 11/2006 | Sugimoto et al. | 361/740 |
| 2010/0059899 | A1 * | 3/2010 | Sakurai et al. | 257/787 |
| 2012/0012659 | A1 * | 1/2012 | Sugimoto et al. | 235/492 |

FOREIGN PATENT DOCUMENTS

WO    WO 00/19513    4/2000

* cited by examiner

*Primary Examiner* — Tuan T Dinh
*Assistant Examiner* — Ahmad D Barnes
(74) *Attorney, Agent, or Firm* — NSIP Law

(57) ABSTRACT

Provided are a vehicle card key and a method of manufacturing the same. The vehicle card key is used to lock/unlock a vehicle door or start an engine in wireless communication with a vehicle. The vehicle card key includes a lower cover, a circuit board stacked on and coupled to a top of the lower cover, and an upper cover coupled to the lower cover as one body to cover an upper side of the circuit board. The lower cover and the upper cover are formed of a thermo-hardening resin.

3 Claims, 4 Drawing Sheets

A-A'

CARD KEY FOR VEHICLE AND MAKING METHOD OF THE SAME

CROSS-REFERENCE TO RELATED APPLICATIONS

This application claims priority under 35 U.S.C. §119 to Korean Patent Application No. 10-2012-0102334, filed on Sep. 14, 2012, the disclosure of which is incorporated herein by reference in its entirety.

TECHNICAL FIELD

The present disclosure relates to a vehicle card key and a method of manufacturing the same, and in particular, to a vehicle card key that is used to lock/unlock a vehicle door or start an engine in wireless communication with a vehicle, and to a method of manufacturing the same.

BACKGROUND

Generally, in a smart key system, a wireless transceiver is mounted on a card key that a user carries. When a user carries the wireless transceiver mounted on the card key and enters into a vehicle, the wireless transceiver communicates with a control unit disposed in the vehicle.

Even when a user merely carries the card key, the wireless transceiver locks/unlocks a vehicle door, starts an engine, or allows the other operations to be performed.

The card key includes a circuit board in which a circuit part is mounted on a resin case of synthetic resins, and a battery is mounted as a power source on the card key.

Moreover, the card key includes a mechanical key that is used when the discharge of the battery, the damage of the wireless transceiver, or a situation similar thereto occurs.

The mechanical key is placed in a hollow space of the resin case.

In an emergency, a user takes out the mechanical key from the hollow space of the resin case, and uses the mechanical key for locking/unlocking or for the other operations.

Recently, the smart key system requires an information exchange system that uses a more number of components and is more complicated, and the card key is required to become thin and small so as to enable a user to easily carry the card key.

Korean Patent Publication No. 10-2012-0006949 discloses a related art vehicle card key that is as illustrated in FIG. 1.

FIG. 1 is an exploded perspective view of the related art vehicle card key. FIG. 2 is a description view illustrating a mold used to manufacture the related art vehicle card key of FIG. 1.

As illustrated in FIGS. 1 and 2, the related art vehicle card key includes a key body 10, a circuit board 31, and a sheet member 20.

The key body 10 is formed of a resin material by insert molding.

An electronic component 32 for wireless communication is mounted on the circuit board 31, which is coupled to one surface of the key body 10.

That is, as illustrated in FIG. 2, when the circuit board 31 has been disposed at a top of a lower mold 61, resin is charged into a cavity 62a, thereby forming the key body 10.

In this case, since the circuit board 31 is disposed at the top of the lower mold 61, when the key body 10 is formed by charging resin into the cavity 62a, the charging of the resin into the cavity 62a is completed, and then a rear surface of the circuit board 31 is exposed to the outside of the key body 10.

Therefore, in the related art, the sheet member 20 that is formed separately from the key body 10 is adhered to the other surface of the key body 10, thereby preventing the circuit board 31 from being exposed to the outside.

As a method different from this, there is a method in which a mold fixing part is formed in a circuit board in order for the circuit board to be disposed in a space between a lower mold and an upper mold, molding of a key body is completed, and then the mold fixing part is removed.

In this case, however, the mold fixing part is removed, and a subsequent process such as a spray process is needed for the removed portion not to be exposed to the outside.

SUMMARY

Accordingly, the present disclosure provides a vehicle card key and a method of manufacturing the same, which prevent a circuit board from being exposed to the outside of the card key even without the adhesion of a sheet member or a subsequent process.

In one general aspect, a vehicle card key includes: a lower cover; a circuit board stacked on and coupled to a top of the lower cover; and an upper cover coupled to the lower cover as one body to cover an upper side of the circuit board, wherein the lower cover and the upper cover are formed of a thermo-hardening resin.

The upper cover may be thermally boned to the lower cover in molding the upper cover, and coupled to the lower cover as one body.

The upper cover may include: an upper cover portion covering the upper side of the circuit board; and an upper side wall portion extension-formed in a direction from a border of the upper cover portion to the lower cover, and coupled to a side surface of the lower cover as one body to surround the side surface of the lower cover.

The vehicle card key may further include a key holder of a metal material coupled to a side portion of the circuit board, and receiving a mechanical key, the key holder being insertion-disposed between the lower cover and the upper cover.

The key holder may include: a first contact portion contacting one surface of the circuit board; a second contact portion contacting the other surface of the circuit board; and a receiving portion extension-formed in an opposite direction of the circuit board from the first and second contact portions, and disposed at the side portion of the circuit board, the receiving portion having a sectional surface that has a hollow tetragonal shape and receives the mechanical key. The first contact portion, the receiving portion, and the second contact portion may be connected as one body. The first contact portion may be fixing-coupled to the circuit board by a coupling member.

In another general aspect, a method of manufacturing a vehicle card key includes: performing a primary molding operation of molding a lower cover; performing a board coupling operation of coupling a circuit board to a top of the lower cover; and performing a secondary molding operation of forming an upper cover that is coupled to the lower cover as one body to cover an upper side of the circuit board.

The lower cover and the upper cover may be formed of a thermo-hardening resin. In the secondary molding operation, the upper cover may be thermally boned to the lower cover in molding the upper cover, and coupled to the lower cover as one body.

A key holder and a battery holder may be mounted on the circuit board. The method may further include: after the board coupling operation and before the secondary molding operation, performing a core forming operation of insertion-mounting a slide core into the key holder and the battery holder.

Other features and aspects will be apparent from the following detailed description, the drawings, and the claims.

DETAILED DESCRIPTION OF EMBODIMENTS

Figure 1:
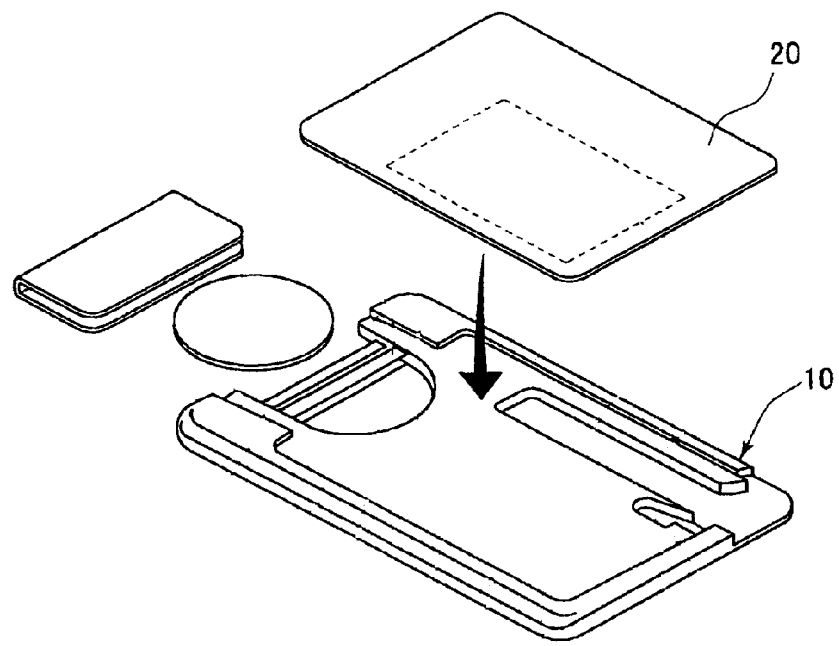
FIG. 1 is an exploded perspective view of the related art vehicle card key.
Figure 2:
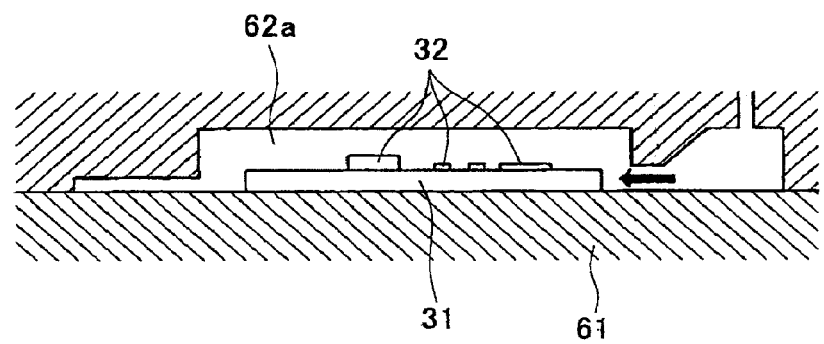
FIG. 2 is a description view illustrating a mold used to manufacture the related art vehicle card key of FIG. 1.

Hereinafter, exemplary embodiments will be described in detail with reference to the accompanying drawings. Throughout the drawings and the detailed description, unless otherwise described, the same drawing reference numerals will be understood to refer to the same elements, features, and structures. The relative size and depiction of these elements may be exaggerated for clarity, illustration, and convenience. The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness. The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 3:
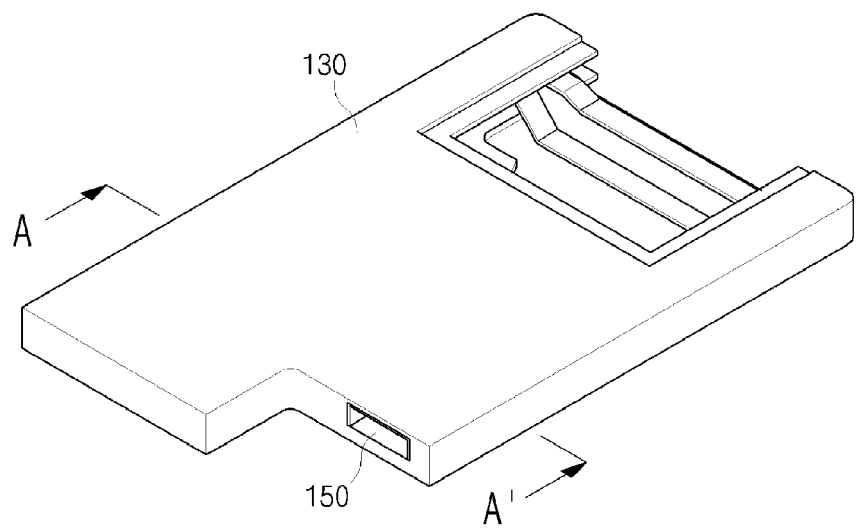
FIG. 3 is a perspective view illustrating a vehicle card key according to an embodiment of the present invention.
Figure 4:
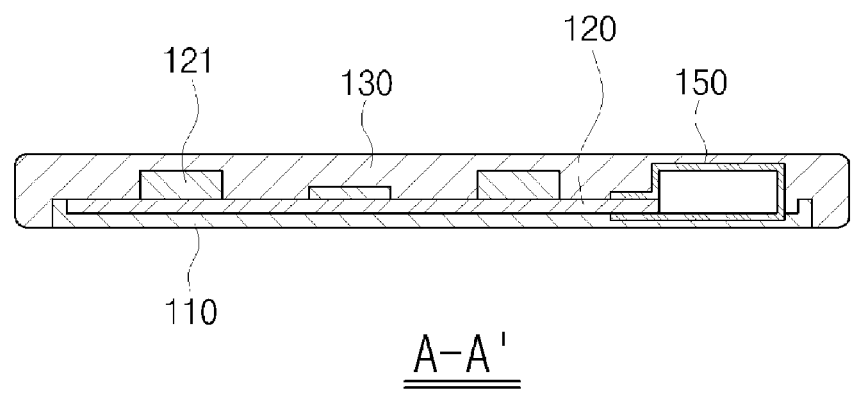
FIG. 4 is a sectional view taken along line A-A' of FIG. 3.
Figure 5:
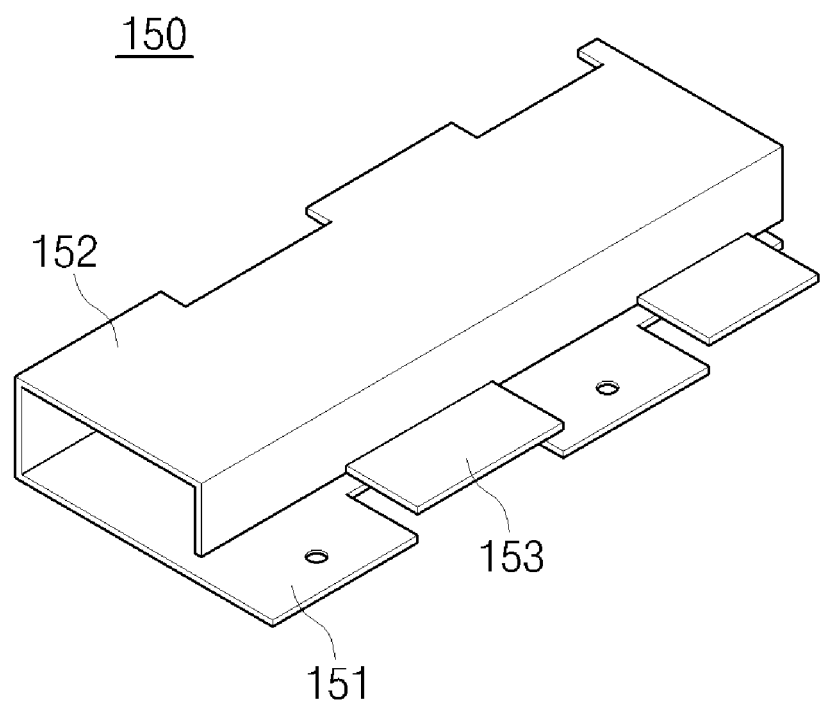
FIG. 5 is a perspective view illustrating a key holder according to an embodiment of the present invention.
Figure 6:
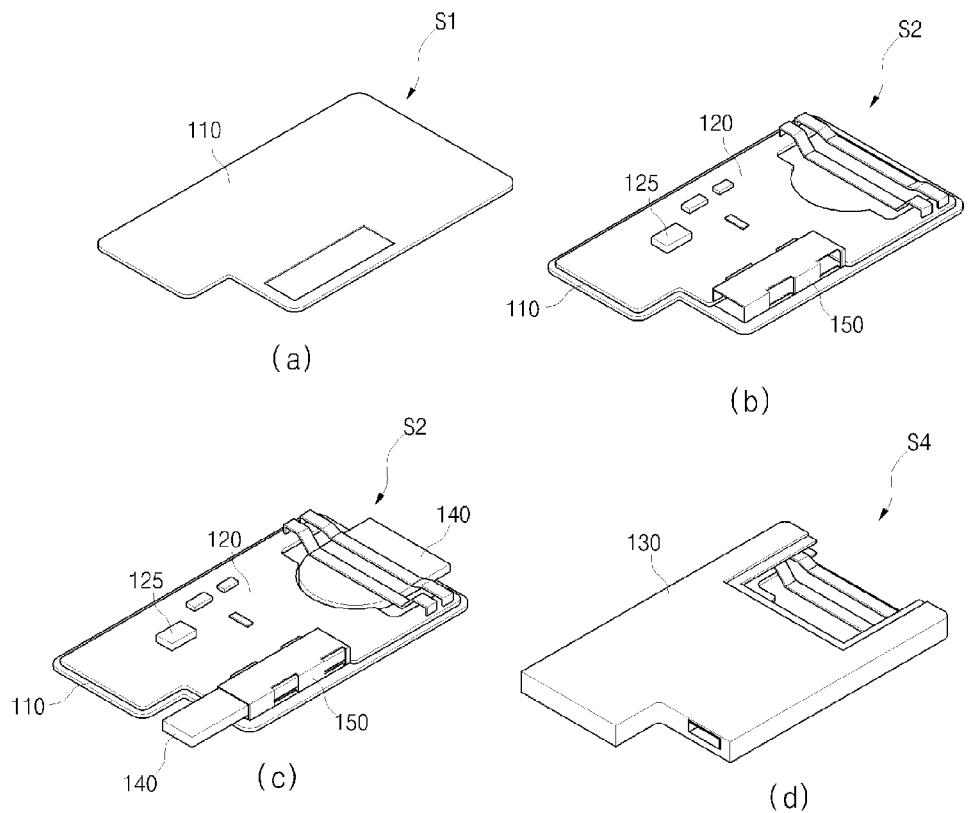
FIG. 6 is views illustrating an operation of manufacturing the card key according to an embodiment of the present invention.

FIG. 3 is a perspective view illustrating a vehicle card key according to an embodiment of the present invention. FIG. 4 is a sectional view taken along line A-A' of FIG. 3. FIG. 5 is a perspective view illustrating a key holder according to an embodiment of the present invention. FIG. 6 is views illustrating an operation of manufacturing the card key according to an embodiment of the present invention.

As illustrated in FIGS. 3 and 4, the vehicle card key include a lower cover 110, a circuit board 120, a key holder 150, and an upper cover 130.

The lower cover 110 is formed in a plate shape, and is a molding material that is molded with a thermo-hardening resin. The lower cover 110 is molded by injection molding or extrusion molding.

An electronic component 121 for wireless communication is mounted on the circuit board 120. The circuit board 120 and the electronic component 121 are stacked on and coupled to a top of the lower cover 110.

In this case, the circuit board 120 is coupled to the top of the lower cover 110 by a separate coupling means without insert injection molding.

That is, the molding of the lower cover 110 is completed, and then the circuit board 120 is coupled to the top of the lower cover 110 through a separate process.

The key holder 150 is coupled to a side portion of the circuit board, and receives a mechanical key (not shown).

The key holder 150 is formed of a metal material as one body, and is insertion-disposed between the lower cover 110 and the upper cover 130.

The key holder 150, as illustrated in FIG. 5, includes a first contact portion 151, a receiving portion 152, and a second contact portion 153.

The first contact portion 151 contacts one surface of the circuit board 120, and is fixing-coupled to the circuit board 120 by a coupling member such as a screw.

The receiving portion 152 is extension-formed in the opposite direction of the circuit board 120 from the first contact portion 151, and disposed at the side portion of the circuit board 120. The receiving portion 152 has a sectional surface that has a hollow tetragonal shape and receives the mechanical key.

The second contact portion 153 is extension-formed in a direction from the receiving portion 152 to the circuit board 120, and disposed at the other surface of the circuit board 120.

The first and second contact portions 151 and 153 are disposed in a mutually opposite direction with the circuit board 120 therebetween.

The first and second contact portions 151 and 153 are disposed alternately, and thus, the key holder 150 is fixed to the circuit board 210 without shaking.

The first contact portion 151, the receiving portion 152, and the second contact portion 153 are connected as one body, and thus, the key holder 150 becomes thinner.

Accordingly, the lower cover 110 and/or the upper cover 130 become(s) relatively thicker than the related art, thus enhancing a buffer function and minimizing the damages of the lower cover 110 and the upper cover 130 due to the drop of a product.

The upper cover 130 covers an upper side of the circuit board 120 with the electronic component 121 mounted thereon, and is coupled to the lower cover 110 as one body.

The upper cover 130 is formed of a thermo-hardening resin, and is a molding material that is manufactured through injection or extrusion molding.

A thermo-hardening resin for molding the upper cover 130 is thermally bonded to a thermo-hardening resin for molding the lower cover 110 in molding the upper cover 130, and the thermo-hardening resin for molding the upper cover 130 is coupled to the thermo-hardening resin for molding the lower cover 110 as one body.

The upper cover 130 includes an upper cover portion 131 that covers the upper side of the circuit board 120, and an upper side wall portion 132 that is extension-formed in a direction from a border of the upper cover portion 131 to the lower cover 110, and coupled to the side surface of the lower cover 110 as one body to surround the side surface of the lower cover 110.

The upper side wall portion 132 is coupled to the side surface of the lower cover 110 to surround the side surface of the lower cover 110, and thus, the upper cover 130 and the lower cover 110 are strongly coupled without detachment therebetween.

The circuit board 120 is disposed inside the molding material by the lower cover 110 and the upper cover 130 without being exposed to the outside, and thus, a subsequent process is not separately required.

The upper cover 130 and lower cover 120 that are the molding materials surround a top and bottom of the circuit board 120, and thus, a product has sufficient durability against the drop or bending of the product.

The above-described vehicle card key of the present invention is manufactured by the following method.

A method of manufacturing the vehicle card key of the present invention includes a primary molding operation S1, a board coupling operation S2, a core forming operation S3, and a secondary molding operation S4.

The primary forming operation S1, as illustrated in FIG. 6 (a), is an operation in which the lower cover 110 is formed of a thermo-hardening resin through injection or extrusion molding.

The board coupling operation S2, as illustrated in FIG. 6 (b), is an operation in which the circuit board 120 is coupled to the top of the lower cover 110.

In this case, in a scheme that couples the circuit board 120 to the top of the lower cover 110, various existing schemes may be used, and for example, the circuit board 120 may be coupled to the top of the lower cover 110 through bonding.

According to the present invention, as described above, in molding the lower cover 110, the circuit board 120 is not simultaneously coupled to the lower cover 110 through insert injection molding, and the circuit board 120 is separately assembled with the lower cover 110 (for which molding is completed through the primary molding operation S1) through the board coupling operation S2.

In this case, with the key holder 150 and a battery holder being mounted on the circuit board 120, the circuit board 120 is coupled to the lower cover 110.

The core forming operation S3, as illustrated in FIG. 6 (c), is an operation in which a slide core 140 that forms a space for inserting the mechanical key and a battery into the circuit board 120 is insertion-mounted into the key holder 150 and the battery holder.

The slide core 140 is removed after the secondary molding operation S4, and forms the space into which the mechanical key and the battery are inserted.

The secondary molding operation S4, as illustrated in FIG. 6 (d), is an operation that injection or extrusion-molds the upper cover 130, which is coupled to the lower cover 110 as one body to cover the upper side of the circuit board 120, with a thermo-hardening resin.

In the secondary molding operation S4, in molding the upper cover 130 without a separate adhesive means, the upper cover 130 is thermally bonded to the lower cover 110 at the same time, and thus, the upper cover 130 and the lower cover 110 are coupled as one body.

According to the present invention, as described above, the lower cover 110 and the upper cover 130 are coupled through injection or extrusion molding, and although the adhesion of a separate element such as a sheet member of the related art is not performed and a subsequent process for the separate element is not separately performed, the circuit board 120 is not exposed to the outside by the lower cover 110 and the upper cover 130.

As described above, in the vehicle card key and the method of manufacturing the same according to the present invention, the circuit board is not exposed to the outside due to the dual molding process (double injection molding or double extrusion molding). Accordingly, a separate element for preventing the exposure of the circuit board is not adhered to the card key, and thus, a subsequent process for the separate element is not required.

Moreover, the key holder is formed as one body and coupled to the side portion of the circuit board, thus lowering the height of the key holder. Accordingly, the lower cover and the upper cover become thicker, thus enhancing the durability of the card key against the drop of the card key.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A vehicle card key, comprising:
   a lower cover;
   a circuit board stacked on and coupled to a top of the lower cover;
   an upper cover coupled to the lower cover as one body to cover an upper side of the circuit board, wherein the lower cover and the upper cover are formed of a thermo-hardening resin; and
   a key holder of a metal material coupled to a side portion of the circuit board, and receiving a mechanical key, the key holder being insertion-disposed between the lower cover and the upper cover,
   wherein the key holder comprises:
   a first contact portion contacting one surface of the circuit board;
   a second contact portion contacting the other surface of the circuit board; and
   a receiving portion extension-formed in an opposite direction of he circuit board from the first and second contact portions. and disposed at the side portion of the circuit board, the receiving portion having a sectional surface that has a hollow tetragonal shape and receives the mechanical key,
   the first contact portion, the receiving portion, and the second contact portion are connected as one body, and
   the first contact portion is fixing-coupled to the circuit board by a coupling member.

2. The vehicle card key of claim 1, wherein the upper cover is thermally bonded to the lower cover in molding the upper cover, and coupled to the lower cover as one body.

3. The vehicle card key of claim 1, wherein the upper cover comprises:
   an upper cover portion covering the upper side of the circuit board; and
   an upper side wall portion extension-formed in a direction from a border of the upper cover portion to the lower cover, and coupled to a side surface of the lower cover as one body to surround the side surface of the lower cover.

* * * * *